United States Patent
Mukouyama

(10) Patent No.: US 8,189,347 B2
(45) Date of Patent: May 29, 2012

(54) PRINTED BOARD UNIT AND FIXING PARTS THEREOF

(75) Inventor: Takahide Mukouyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 725 days.

(21) Appl. No.: 12/275,467

(22) Filed: Nov. 21, 2008

(65) Prior Publication Data

US 2009/0175015 A1 Jul. 9, 2009

(30) Foreign Application Priority Data

Jan. 8, 2008 (JP) ................................. 2008-001267

(51) Int. Cl.
*H05K 1/11* (2006.01)

(52) U.S. Cl. ........ 361/804; 361/790; 361/742; 361/770; 361/803; 411/783; 174/138 G; 24/289; 24/453

(58) Field of Classification Search ................. 361/804, 361/790, 742, 758, 770, 785, 792, 784, 803; 411/383, 378; 174/138 G; 24/289, 453
See application file for complete search history.

(56) References Cited

U.S. PATENT DOCUMENTS

| | | | | | |
|---|---|---|---|---|---|
| 2,936,015 | A | * | 5/1960 | Rapata | 411/182 |
| 3,812,381 | A | * | 5/1974 | Guyton | 361/803 |
| 3,836,703 | A | * | 9/1974 | Coules | 174/138 D |
| 4,149,764 | A | * | 4/1979 | Mattingly, Jr. | 439/75 |
| 4,527,312 | A | * | 7/1985 | Ruehl et al. | 24/453 |
| 4,533,200 | A | * | 8/1985 | Wilson | 439/395 |
| 4,640,639 | A | * | 2/1987 | Matsui | 403/24 |
| 4,797,113 | A | * | 1/1989 | Lambert | 439/74 |
| 4,969,065 | A | * | 11/1990 | Petri | 361/804 |
| 5,018,982 | A | * | 5/1991 | Speraw et al. | 439/74 |
| 5,956,835 | A | * | 9/1999 | Aksu | 29/468 |
| 6,280,202 | B1 | * | 8/2001 | Alden et al. | 439/66 |
| 6,399,888 | B1 | * | 6/2002 | Chen | 174/138 G |
| 6,901,646 | B2 | * | 6/2005 | Yoon | 29/453 |
| 2005/0079748 | A1 | * | 4/2005 | Kim | 439/92 |

FOREIGN PATENT DOCUMENTS

| | | |
|---|---|---|
| JP | 63-87883 | 6/1988 |
| JP | 2-68490 | 5/1990 |
| JP | 3-124088 | 5/1991 |

(Continued)

OTHER PUBLICATIONS

Korean Patent Office Notice Requesting Submission of Opinion dated Aug. 25, 2010 for corresponding Korean Patent Application No. 10-2008-0127916.

Taiwanese Office Action issued Jun. 28, 2011 in corresponding Taiwanese Patent Application 097145707.

(Continued)

*Primary Examiner* — Angel R Estrada
*Assistant Examiner* — Dimary Lopez
(74) *Attorney, Agent, or Firm* — Staas & Halsey LLP

(57) ABSTRACT

A technique is provided for improvement in convenience and in cost reduction of a fixing part of a printed board unit. A printed board unit includes a plurality printed board including a first printed board and a second printed board; and at least one fixing part, interposed between the first printed board and the second printed board, fixing the first printed board and the second printed board such that the first printed board and the second printed board overlap and keep a predetermined space between the first printed board and the second printed board, and the fixing part variably determines the predetermined space.

15 Claims, 17 Drawing Sheets

FOREIGN PATENT DOCUMENTS

| | | |
|---|---|---|
| JP | 7-162121 | 6/1995 |
| JP | 8-330699 | 12/1996 |
| JP | 2003-110210 | 4/2003 |
| JP | 2003-283072 | 10/2003 |
| JP | 2007-287826 | 11/2007 |

OTHER PUBLICATIONS

Japanese Patent Office Notification of Reasons for Refusal, mailed Mar. 6, 2012, for corresponding Japanese Patent Application No. 2008-001267.

* cited by examiner

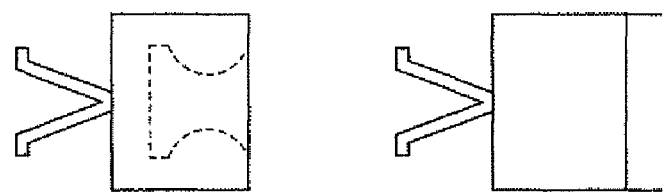
FIG. 15G
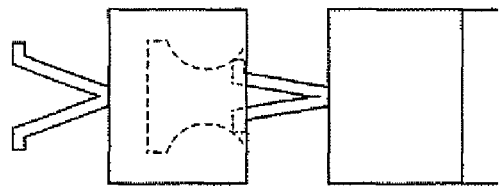
FIG. 15F
FIG. 15E
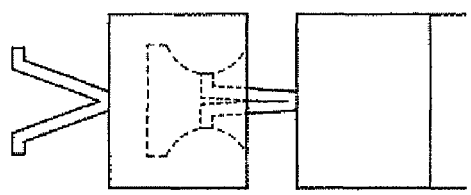
FIG. 15D
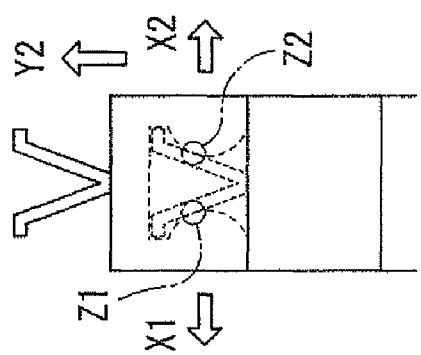
FIG. 15C
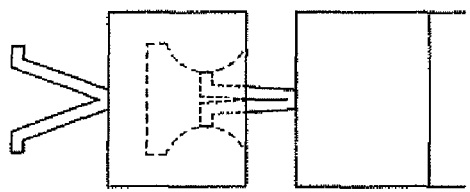
FIG. 15B
FIG. 15A
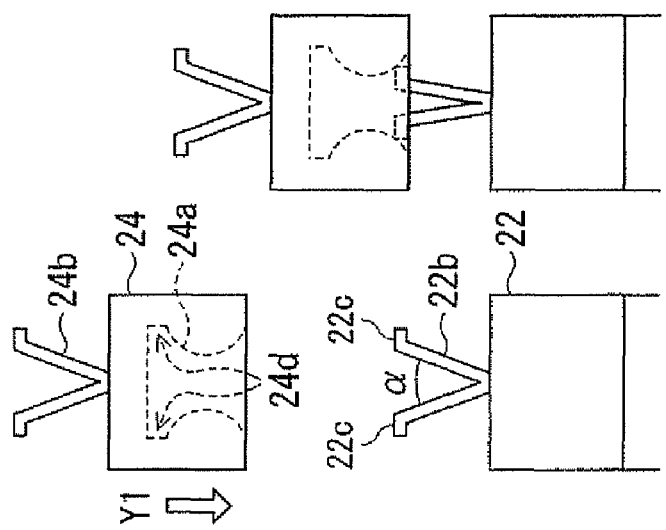

FIG. 16C

FIG. 18A
FIG. 18B
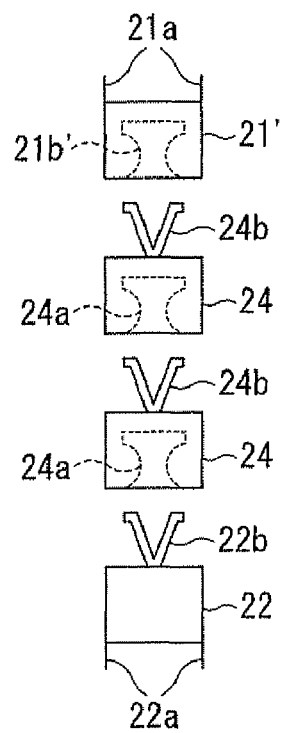
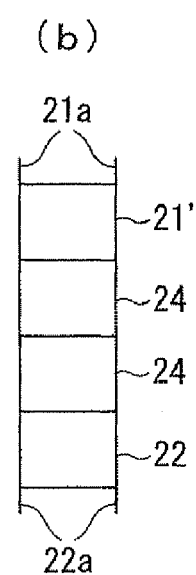
FIG. 19A
FIG. 19B
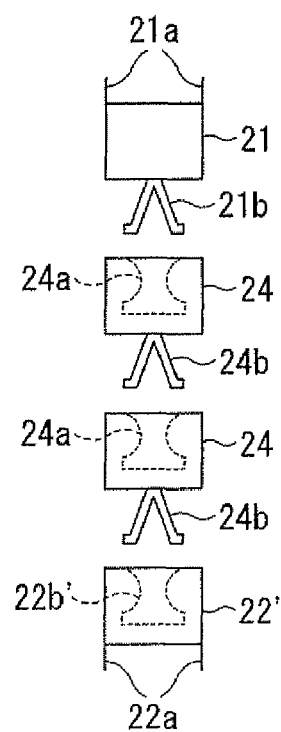
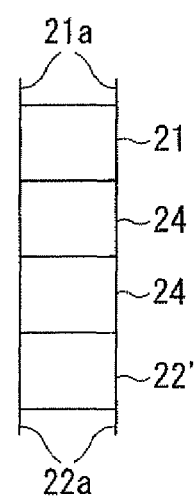

PRINTED BOARD UNIT AND FIXING PARTS THEREOF

CROSS-REFERENCE TO RELATED APPLICATION(S)

This application is based upon and claims the benefit of priority of the prior Japanese Application No. 2008-001267, filed on Jan. 8, 2008 in Japan, the entire contents of which are hereby incorporated by reference.

FIELD

The embodiments discussed herein are directed to a fixing part to fix two printed boards of a printed board unit, keeping a predetermined space between the boards.

BACKGROUND

In accordance with improvement in functions and throughput of recent electronic devices, there have been provided a composite substrate (hereinafter called a printed board unit) in which a number of printed boards have different functions and are one another coupled by flexible wiring boards with the intention of avoiding the generation of interference (noise) caused by signal patterns having different functions.

Since demands for electronic devices highly integrated and compact in size increase the number of elements to be mounted to a specific board region, a single printed board is incapable of accommodating all the elements. As one of the solutions, there are provided many printed board units each in which a number of printed board are formed into a stack and are one another coupled via cables and connectors.

Some techniques have conventionally arranged a number of printed boards to keep predetermined space via fixing parts (spacers) in such a printed board unit.

For example, as shown in FIGS. 24A and 24B, conventional printed board unit 100 includes printed boards 101 and 103 fixed to each other such that printed board 103 overlaps printed board 101 via spacer 102. FIG. 24A is the top view of printed board unit 100, and FIG. 24B is the front view of printed board unit 100.

Spacer 102 is coupled to printed boards 101 and 103 by screws or sets of a bolt and a nut.

Signal patterns formed on printed boards 101 and 103 are connected to each other by flexible wiring board (FPC: Flexible Printed Circuit board) 104 to let printed boards 101 and 103 cooperate. For example, printed board 101 and printed board 103 function as a common circuit and a high-speed signal unit, respectively. (For example, Japanese Patent Application Laid-Open No. 2003-110210, Japanese Patent Application Laid-Open No. 2003-283072, and Japanese Patent Application Laid-Open No. HEI 8-330699)

Conventionally, spacer 102 has been designed for each printed board unit 100. In other words, the height and other outlines of spacer 102 is determined according to elements to be mounted on printed board 101 and printed board 103 and a location of installation of printed board unit 100 when printed board unit 100 is designed.

For this reason, if a variation or addition of elements to be mounted on printed board 101 or 103 requires modification of spacer 102, the height of spacer 102 is re-determined and another spacer is newly produced, giving inconvenience and increasing the production cost for another spacer.

In production of a number of different kinds of printed board units 100, spacers 102 have to be designed one for each kind of printed board unit 100, requiring both workload and cost.

SUMMARY

There is provided a printed board unit comprising: a plurality printed board including a first printed board and a second printed board; and at least one fixing part, interposed between the first printed board and the second printed board, fixing the first printed board and the second printed board such that the first printed board and the second printed board overlap and keep a predetermined space between the first printed board and the second printed board, wherein the fixing part variably determines the predetermined space.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 1A is the top view, FIG. 1B is a side view seen from the right; and FIG. 1C is the front view;

FIG. 2A is a front view of the fixing part being combined; and FIG. 2B is a front view of the fixing part being divided;

FIG. 3A is a front view of the printed board unit with the fixing part formed of a first fixing piece, a second fixing piece, and first intermediate fixing piece; and FIG. 3B is a front view of the printed board with the fixing part additionally including a second intermediate fixing piece to that shown in FIG. 3A;

FIG. 4A shows a state before pieces are combined; and FIG. 4B shows a state after all the pieces shown in FIG. 4A are combined;

FIG. 5A is the top view; and FIG. 5B is the A-A' sectional view of FIG. 5A;

FIG. 6A is the top view of the printed board; and FIG. 6B is a perspective view of the printed board with lands into which tips of the fixing part are being inserted;

FIG. 9A is the top view, FIG. 9B is a side view seen from the right; and FIG. 9C is the front view;

FIG. 11A shows a state before pieces are combined; and FIG. 11B shows a state after all the pieces shown in FIG. 11A are combined;

FIG. 12A is the front view of the first fixing piece and the second fixing piece; FIG. 12B is the top view thereof; FIG. 12C is the bottom view thereof; and FIG. 12D is the side view seen from the right;

FIG. 13A is the front view of the second intermediate fixing piece; FIG. 13B is the top view thereof; FIG. 13C is the bottom view thereof, FIG. 13D is the side view seen from the right; and FIG. 13E is the C-C' sectional view of FIG. 13B;

FIGS. 15A-15G are diagrams showing transition of from the combining state of the second fixing piece and the second intermediate fixing piece to the drawing state of the pieces; FIG. 15A shows a state before the combining; FIG. 15B shows a state of the start of the combining; FIG. 15C shows a state of being in the middle of the combining; FIG. 15D shows a state of the completion of the combining; FIG. 15E shows a state of being in the middle of the drawing; FIG. 15F shows a state of being at the end of the drawing and FIG. 15G shows a state of being the completion of the drawing;

FIGS. 16A-16E are diagrams showing the configuration of the first intermediate fixing piece of the fixing part of the printed board unit of the second embodiment; FIG. 16A is the front view of the first intermediate fixing piece; FIG. 16B is the top view; FIG. 16C is the bottom view; FIG. 16D is the side view seen from the right; and FIG. 16E is the D-D' sectional view of FIG. 16B;

FIGS. 18A and 18B are diagrams showing an exemplary fixing part of the printed board unit of a modification of the present invention; FIG. 18A shows a state before pieces are combined; and FIG. 18B shows a state after all the pieces shown in FIG. 18A are combined;

FIGS. 19A and 19B are diagrams showing an exemplary fixing part of the printed board unit of another modification; FIG. 19A shows a state before pieces are combined; and FIG. 19B shows a state after all the pieces shown in FIG. 19A are combined;

FIG. 23A shows a state before adjustment of the predetermined space between printed boards; and FIG. 23B shows a state in which the predetermined space has been adjusted to be narrow; FIG. 24A is the top view of the printed board unit, and FIG. 24B is the front view thereof.

DESCRIPTION OF THE PREFERRED EMBODIMENTS

Various preferred embodiments of the present invention will now be described with reference to the accompanying drawings.

(1) First Embodiment

Figure 1A:
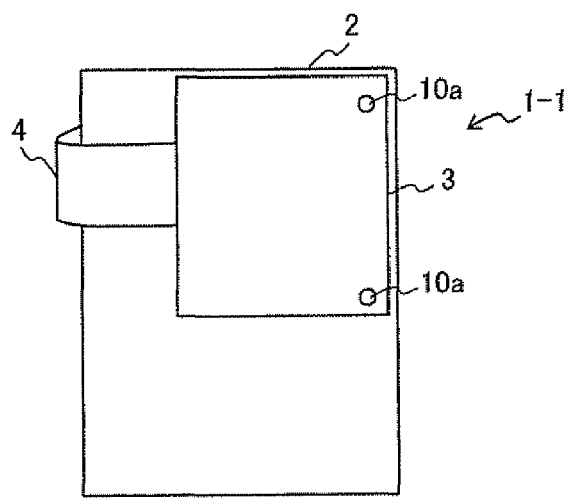
FIGS. 1A-1C are diagrams schematically illustrating a printed board unit according to a first embodiment.
Figure 1B:
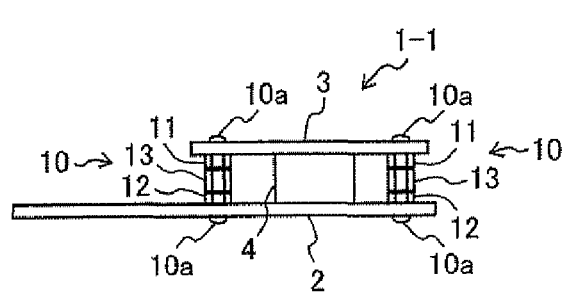
Figure 1C:
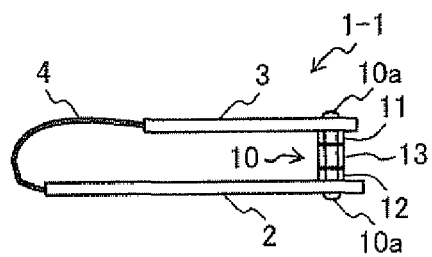

First, the configuration of printed board unit 1-1 of the first embodiment will now be described with reference to FIGS. 1A-1C. FIGS. 1A, 1B, and 1C are the top view, the side view seen from the right and the front view of printed board unit 1-1.

As shown in FIGS. 1A-1C, printed board unit 1-1 comprises printed boards (rigid wiring boards) 2 and 3, flexible wiring board (e.g., FPC) 4, and two fixing parts 10.

Printed boards 2 and 3 mount electronic parts and elements thereon, but the parts and elements do not appear in FIGS. 1A-1C and FIGS. 2A, 2B, 3A, 3B, 6A and 6b to be detailed below for the purpose of simplification.

Wiring board 4 connects wiring patterns on printed board 2 and 3 to each other and has flexibility.

The connection established by wiring board 4 makes printed boards 2 and 3 to co-operate. For example, printed board 2 and printed board 3 function as a common circuit and a high-speed signal unit, respectively.

Fixing part 10 is interposed between printed board 2 and printed board 3 and fixes printed board 2 and printed board 3 such that printed boards 2 and 3 overlap, keeping a predetermined space.

Fixing part 10 is coupled to printed boards 2 and 3 by solder, which is represented by reference number 10a in FIGS. 1A-1C.

Fixing part 10 has a divided structure and specifically includes first fixing piece 11 fixed to printed board 3, second fixing piece 12 fixed to printed board 2, and first intermediate fixing piece 13 interposed between first fixing piece 11 and second fixing piece 12.

In other words, fixing part 10 is formed of a number of fixing pieces 11-13 connected in the direction in which the predetermined space between printed boards 2 and 3 varies. An increase or a decrease in the number of second intermediate fixing pieces 14 (see FIGS. 3 and 4 to be described below) to be detailed below can vary the length of the predetermined space between printed boards 2 and 3.

Figure 2A:
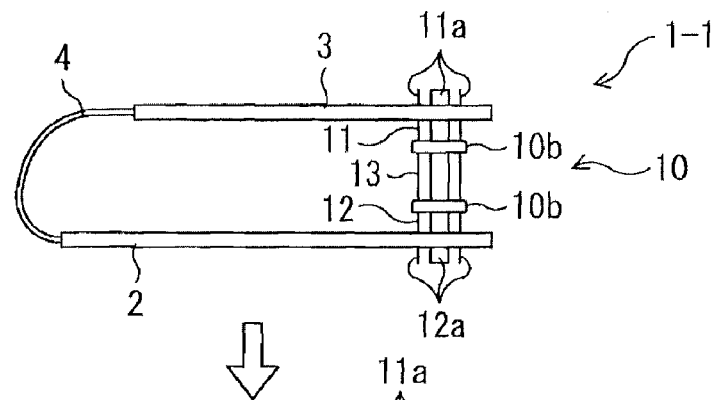
FIGS. 2A and 2B are diagrams schematically illustrates the divided structure of a fixing part of the printed board unit of the first embodiment.

Specifically as shown in FIG. 2A, first fixing piece 11 and second fixing piece 12 are individually coupled to first intermediate fixing piece 13 via spring washers 10b. Here, spring washer 10b is a piece of a washer having elasticity (repulsion). The presence of spring washers 10b makes it possible to prevent vibration or other causes from loosing the fitting state between first fixing piece 11 and first intermediate fixing piece 13 and between second fixing piece 12 and first intermediate fixing piece 13.

Further, first fixing piece 11 includes conductive tips (leads) 11a, which electrically couple first fixing piece 11 to printed board 3. Similarly, second fixing piece 12 includes conductive tips 12a, which electrically couple second fixing piece 12 to printed board 2. The electrically connection between first fixing piece 11 and printed board 3 and that between second fixing piece 12 and printed board 2 are detailed below with reference of FIGS. 6A, 6B and 7.

First fixing piece 11, second fixing piece 12, first intermediate fixing piece 13, and second intermediate fixing piece 14 each individually takes the form of a hexagonal prism. In particular, first intermediate fixing piece 13 and second intermediate fixing piece 14 are configured to be easily rotatable with hands and spanners. Such a configuration allows a fabricator to easily attach and remove first intermediate fixing piece 13 and second intermediate fixing piece 14.

Figure 2B:
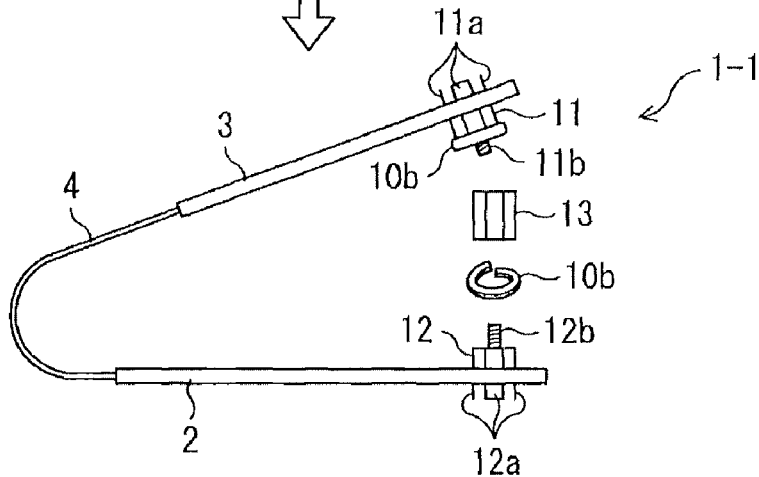

Fixing part 10 is configured to be divided into pieces as shown FIG. 2B from a state shown in FIG. 2A.

First fixing piece 11 comprises male screw 11b projecting toward printed board 2, which screw screws into a female screw (i.e., female screw 13a shown in FIG. 5B detailed below) of first intermediate fixing piece 13 to couple first fixing piece 11 to first intermediate fixing piece 13. The structure detachably couples first fixing piece 11 and first intermediate fixing piece 13.

Similarly, second fixing piece 12 comprises male screw 12b projecting toward printed board 3, which screw screws into a female screw (female screw 13b of FIG. 5B to be described below) of first intermediate fixing piece 13 to couple second fixing piece 12 to first intermediate fixing piece 13. The structure detachably couples second fixing piece 12 and first intermediate fixing piece 13.

Figure 3A:
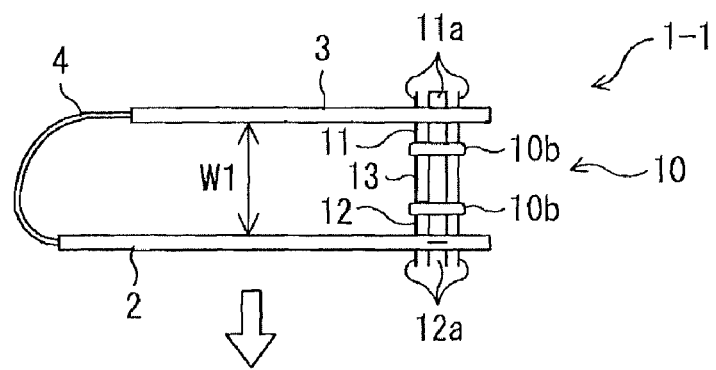
FIGS. 3A and 3B are diagrams showing increase or decrease in the length of the fixing unit of the printed board unit of the first embodiment.
Figure 3B:
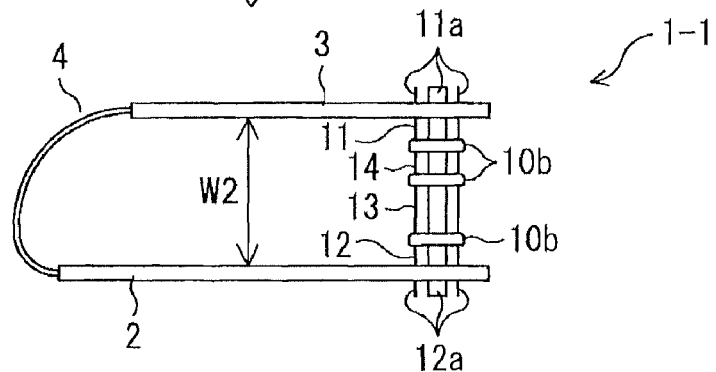

Fixing part 10 is configured to vary from a state shown in FIG. 3A to a state shown in FIG. 3B in which fixing part 10 additionally includes single second intermediate fixing piece 14.

The example shown in FIG. 3B additionally have second intermediate fixing piece 14 interposed between first fixing piece 11 and first intermediate fixing piece 13. The addition changes the predetermined space W1 between printed boards 2 and 3 shown in FIG. 3A to space W2 larger than space W1. Here, since wiring board 4 is flexible, the bending of wiring board 4 varies with an increase or a decrease (widening or narrowing) in the length of fixing part 10. Accordingly, wiring board 4 does not inhibit the adjustment of the predetermined space between printed boards 2 and 3 conducted by increasing and decreasing the length of fixing part 10.

Here, description will be made in relation to the detailed structure of first intermediate fixing piece 13 and second intermediate fixing piece 14 of fixing part 10 with reference to FIGS. 4A, 4B, 5A and 5B. The example shown in FIGS. 4A and 4B has second intermediate fixing pieces 14 interposed between first fixing piece 11 and first intermediate fixing piece 13 and between second fixing piece 12 and first intermediate fixing piece 13.

Figure 4A:
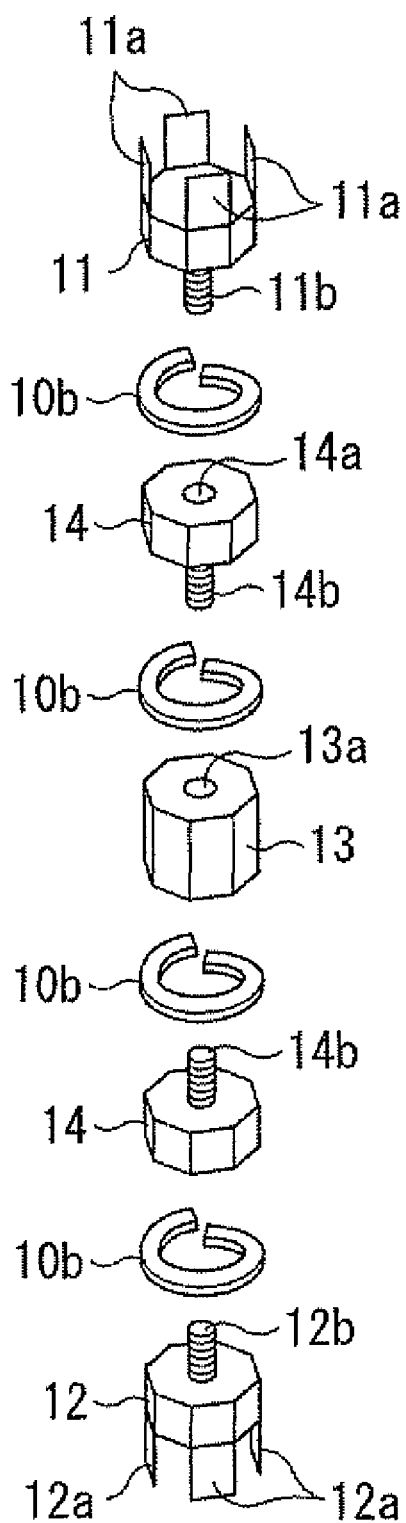
FIGS. 4A and 4B are diagrams showing an exemplary fixing part of the printed board unit of the first embodiment.

As shown in FIG. 4A, second intermediate fixing piece 14 comprises female screw 14a into which male screw 11b of first fixing piece 11 or male screw 12b of second fixing piece 12 is screwed. Further, second intermediate fixing piece 14 comprises male screw 14b projecting toward printed board 2 or printed board 3 on the opposite side to that with female screw 14a. In FIG. 4A, female screw 14a of second intermediate fixing piece 14 does not appear which screw is to be coupled to second fixing piece 12. However, the same second intermediate fixing piece 14 coupled to second fixing piece 12 comprises female screw 14a on the opposite side to that with female screw 14b similarly to another second intermediate fixing piece 14 to be coupled to first fixing piece 11.

First intermediate fixing piece 13 comprises female screw 13a into which male screw 11b of first fixing piece 11 or female screw 14b of second intermediate fixing piece 14 is screwed.

Figure 4B:
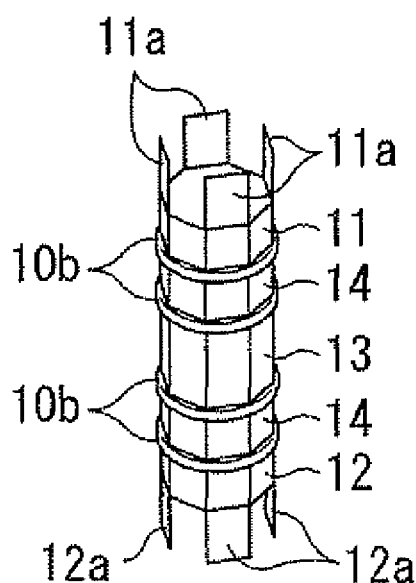

Namely, in the example shown in FIGS. 4A and 4B, into female screw 13a of first intermediate fixing piece 13, female screw 14b of second intermediate fixing piece 14 is screwed, but removal of second intermediate piece 14 causes male screw 11a of first fixing piece 11 to screw into female screw 13a.

Figure 5A:
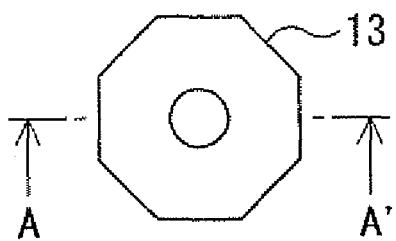
FIGS. 5A and 5B are diagrams showing the first intermediate fixing piece of the fixing part of the printed board unit of the first embodiment.
Figure 5B:
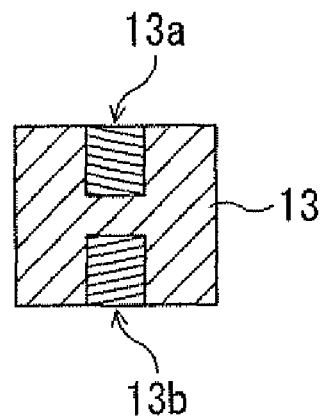

Here, FIG. 5A is the top view of first intermediate fixing piece 13 and FIG. 5B is the A-A' sectional view of FIG. 5A.

As shown in FIG. 5B, first intermediate fixing piece 13 includes female screw 13b, into which male screw 12b of second fixing piece 12 or female screw 14b of second intermediate fixing piece 14 is screwed, on the opposite side to the side with female screw 13a.

Counterclockwise turning first intermediate fixing piece 13 when pieces are combined one another to form fixing part 10 shown in FIG. 4B unscrews male screw 14b of second intermediate fixing piece 14 between first intermediate fixing piece 13 and first fixing piece 11 from first intermediate fixing piece 13a and concurrently unscrews male screw 14b of second intermediate fixing piece 14 between first intermediate fixing piece 13 and second fixing piece 12 from female screw 13b.

Conversely, in order to screw second intermediate fixing pieces 14 between first intermediate fixing piece 13 and first fixing piece 11 and between first intermediate fixing piece 13 and second fixing piece 12 into first intermediate fixing piece 13, clockwise turning first intermediate fixing piece 13 while predetermined force is applied to contact each of male screws 14b of both of second intermediate fixing pieces 14 with corresponding one of female screws 13a and 13b, so that two male screws 14b simultaneously screw into corresponding female screws 13a and 13b to couple two second intermediate fixing pieces 14 to first intermediate fixing piece 13.

Further, in the example shown in FIGS. 4A and 4B, into female screw 13b of first intermediate fixing piece 13, male screw 13a of second intermediate fixing piece 14 is screwed. When second intermediate fixing piece 14 is removed, male screw 12a of second fixing piece 12 screws into female screw 13a.

Properly coupling all the pieces shown in FIG. 4A forms fixing part 10 shown in FIG. 4B. Removal of second intermediate fixing piece 14 decrease the height of fixing part 10, so that the space between printed boards 2 and 3 can be adjusted to be narrower.

On the other hand, fixing part 10 being in the state shown in FIG. 4B has a structure in which one of more second intermediate fixing pieces 14 can be inserted between first fixing piece 11 and second intermediate fixing piece 14, between second intermediate fixing piece 14 and first intermediate fixing piece 13, and/or between second intermediate fixing piece 14 and second fixing piece 12. In other words, female screw 14a of second intermediate fixing piece 14 is accommodatable female screw 14b of another second intermediate fixing piece 14, so that the female screw 14b can screw into female screw 14a.

Addition of one of more second intermediate fixing pieces 14 to fixing part 10 increases the height of fixing part 10, so that the space between printed boards 2 and 3 is adjusted to be wider.

Fixing part 10 is made of conductive material and is connected to the power supplying wire of printed board 2 to supply electricity to printed board 3.

For example, spring washer 10b, first fixing piece 11, second fixing piece 12, first intermediate fixing piece 13 and second intermediate fixing piece 14 are formed of conductive material, which is preferably covered with insulation material (e.g., insulation resin). That avoids generation of noise caused from electricity supply through fixing part 10, so that there is no adverse effect on electronic parts (not shown) and signal patterns (not shown) of printed boards 2 and 3. In addition, the insulation cover can prevent a person touching fixing part 10 from receiving an electric shock.

Here, description will now be made in relation to a specific connection structure between fixing part 10 and each of printed boards 2 and 3 with reference to FIGS. 6A, 6B and 7.

Figure 6A:
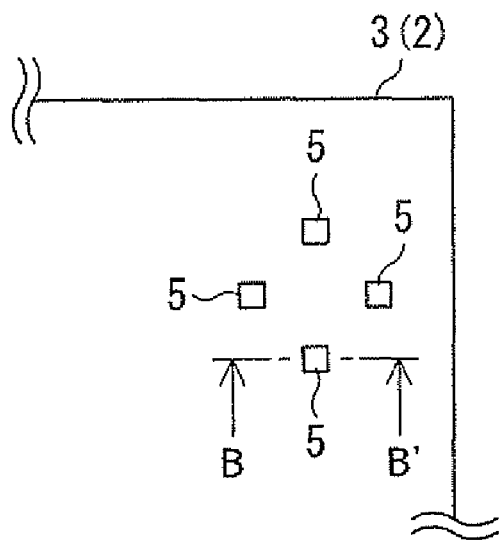
FIGS. 6A and 6B are diagrams showing a connection structure between the printed board and the fixing part of the printed board unit of the first embodiment.

As shown in FIG. 6A, printed board 3 includes through-hole lands (hereinafter simply called lands) 5 which have been plated for insertion and into which tips 11a of first fixing piece 11 are inserted. Here, since first fixing piece 11 includes four tips 11a, printed board 3 has four lands 5 corresponding one to each tip 11a.

Figure 6B:
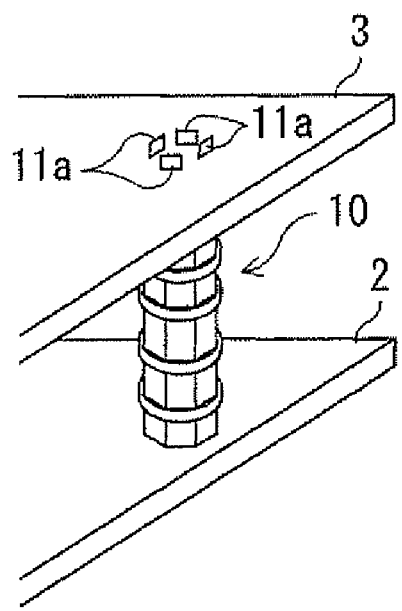

As shown in FIG. 6B, each of lands 5 in which tip 11a is being inserted is soldered such that tip 11a is covered, and first fixing piece 11 of fixing part 10 is thereby coupled to printed board 3.

FIG. 6B shows only insertion of first fixing piece 11, but tips 12a of second fixing piece 12 are inserted to lands 5 of printed board 2 similarly to tips 11a. Keeping the above insertion state, lands 5 on printed board 2 are soldered such that tips 12a are covered, and second fixing piece 12 of fixing part 10 is thereby is coupled to printed board 2.

Figure 7:
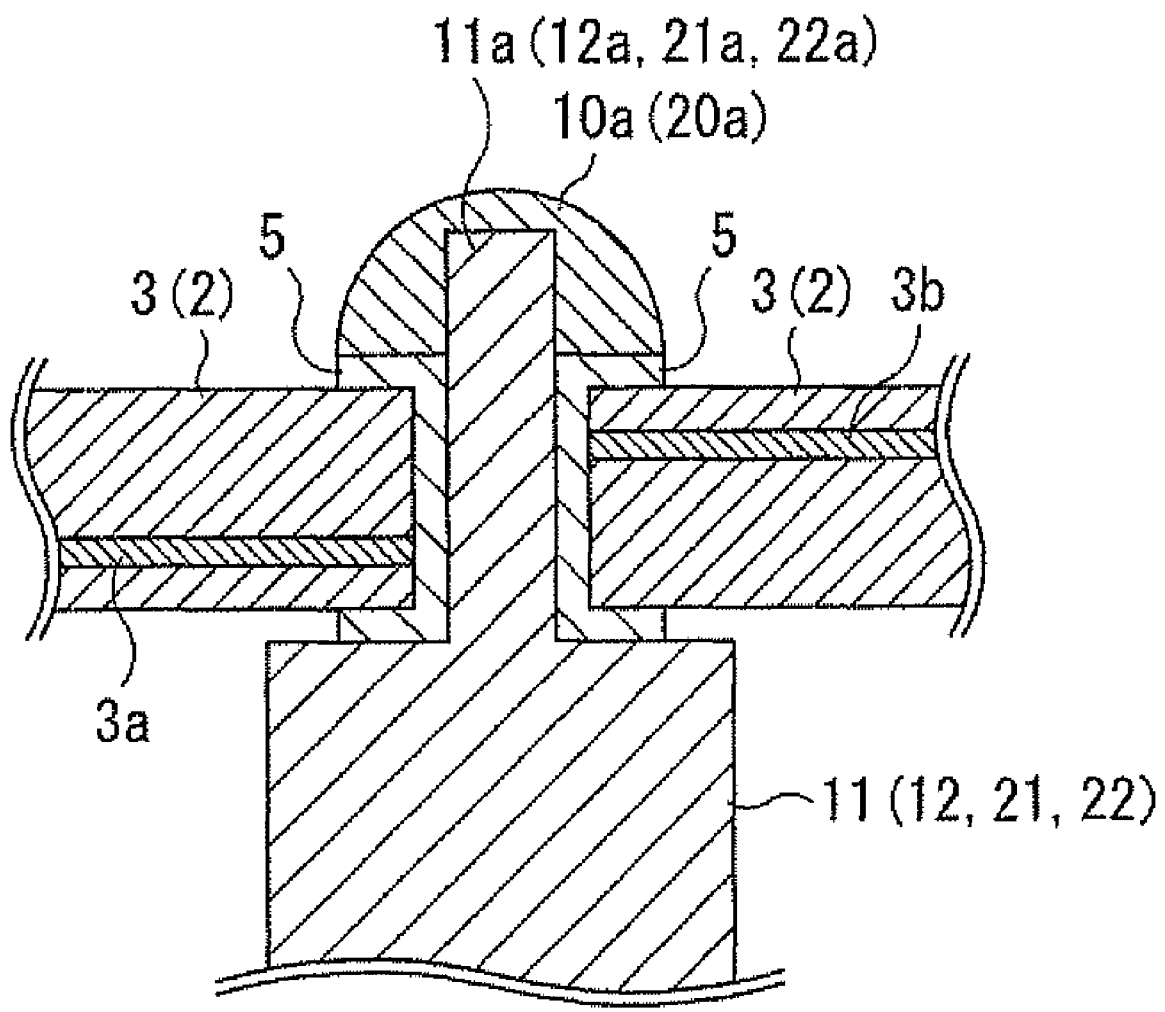
FIG. 7 is a B-B' sectional view of FIG. 6A showing the state of a tip of the fixing part being inserted into a land of the printed board and soldered to the land on a printed board of the printed board unit according to the first and the second embodiments.

FIG. 7 is a B-B' sectional view of FIG. 6A in which tip 11a of first fixing piece 11 is inserted into land 5 and is soldered to a printed board. Here, although solder 10a shown in above FIGS. 1A-1C collectively solders the four tips 11a to cover all the tips, solder 10a shown in FIG. 7 solders an individual tip 11a. The present invention does not limit the soldering manner.

As shown in FIG. 7, printed board 3 has an inner layer with power supplying patterns 3a and 3b, and lands 5 are formed of conductive material and contacting electricity supply patterns 3a and 3b.

Soldering land 5 and tip 11a of first fixing piece first fixing piece 11 being inserted into the land 5 electrically couples the tip 11a and the land 5.

Accordingly, tips 11a of first fixing piece 11 are electrically coupled to power supplying patterns 3a and 3b via land 5.

In the same manner, tips 12a of second fixing piece 12 are electrically coupled to power supplying pattern (an electricity source wire) or the like on printed board 2 via lands 5. It is preferable that printed board 2 has an inner layer with an electricity supply pattern.

Electrically coupling first fixing piece 11 to printed board 3 makes it possible to supply power to printed board 3 from printed board 2 through fixing part 10.

For example, when fixing part 10 shown in FIG. 4B is coupled to printed boards 2 and 3, electricity from printed board 2 is flown through, in sequence from the bottom of FIG. 4B, second fixing piece 12, second intermediate fixing piece 14, first intermediate fixing piece 13, second intermediate fixing piece 14, and first fixing piece 11 and is finally supplied to printed board 3 by tips 11a. Alternatively, electricity may also be flown through spring washers 10b.

Tips 12a of second fixing piece 12 are preferably coupled to lands 5 of printed board 2 in the same manner as the connection between tips 11a of first fixing piece 11 and lands 5 of printed board 3 because soldering first fixing piece 11 and second fixing piece 12 respectively to printed board 3 and printed board 2 improves the conductivity as compared with connection by means of screws.

Figure 8:
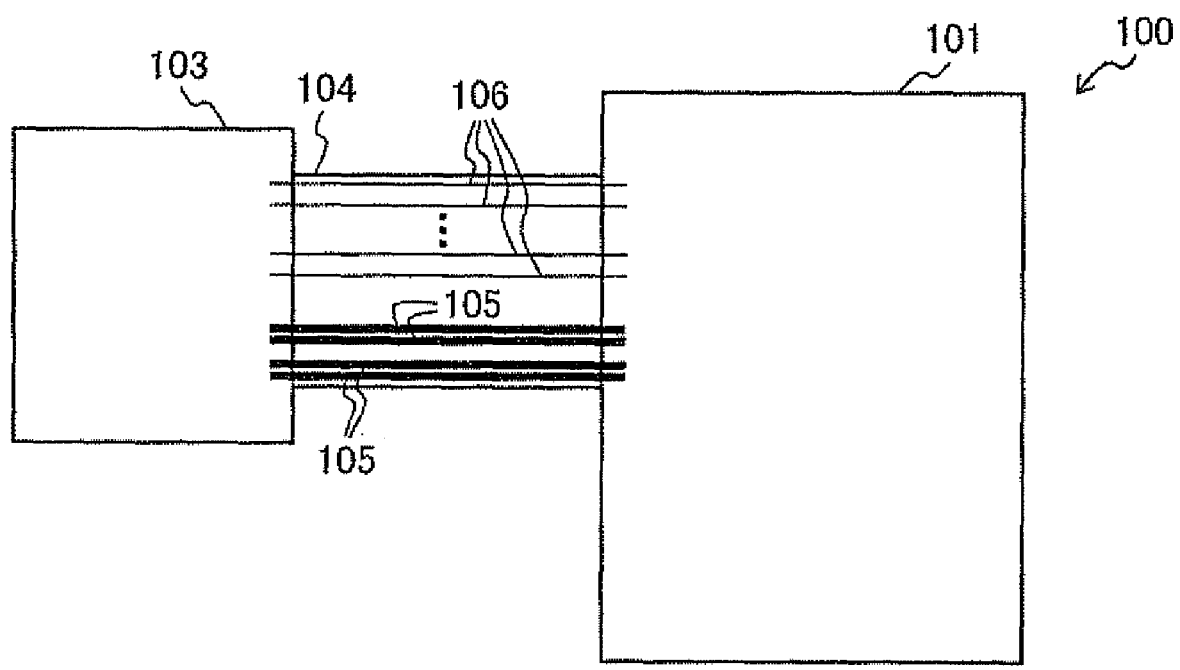
FIG. 8 is a diagram schematically showing a configuration of a rigid wiring board of a conventional printed board unit.

To ensure power supplying to printed board 103 from printed board 101, there has conventionally been formed electricity supply pattern 105 on flexible wiring board 104, as shown in FIG. 8.

However, power supplying pattern 105 has adverse effects such as noise on signal pattern 106 of wiring board 104. To avoid this, wiring board 104 has required a space more than a predetermined length between electricity supply pattern 105 and signal pattern 106, resulting in widening wiring board 104 and hindering the high integration.

Another solution may form wiring board 104 into a multi-layer and may position signal pattern 106 and power supplying pattern 105 in different layers. However, this case also results in an increase in the thickness of wiring board 104, hindering the high integration and rising the cost.

Printed board unit 1-1 of the present invention supplies power from printed board 2 to printed board 3 through fixing part 10 without wiring board 4. Electronic devices incorporating printed board unit 1-1 of the present invention can therefore be highly integrated without cost rise.

As described above, printed board unit 1-1 of the first embodiment of the present invention has fixing part 10 which fixes printed boards 2 and 3 such that the printed boards 2 and 3 overlap and keep a predetermined space and which can vary the predetermined space. With this configuration, since the space between printed boards 2 and 3 can vary without requiring another fixing part, fixing part 10 serving as a spacer has an improved convenience and lowers the cost as compared with the preparation of another fixing part.

Further, in fabrication of a different printed board unit from printed board unit 1-1, there is no requirement to design and produce another fixing part for the new printed board unit, improving the convenience and decreasing the fabrication cost. In addition, even if the space between printed boards 2 and 3 needs to vary according to electronic devices to be mounted on printed board unit 1-1, a conventional printed board unit cannot endure the variation, but printed board unit 1-1 of the first embodiment can cope with the variation.

Fixing part 10 consists of a number pieces coupled in a direction in which the predetermined space between printed boards 2 and 3 is lengthened and shortened, and increase or decrease in the number of pieces can be vary the predetermined space. In other words, fixing part 10 has a divided structure and can increase or decrease the number of pieces constituting fixing part 10. Accordingly, the predetermined space between printed boards 2 and 3 can be freely modified any number of times after the formation of printed board unit 1-1, improving the convenience.

Specifically, since fixing part 10 includes first fixing piece 11, second fixing piece 12, first intermediate fixing piece 13, and optionally one or more second intermediate fixing pieces 14, the above advantages can be surely attained, and even after the fabrication of printed board unit 1-1, the space between printed boards 2 and 3 can be easily modified.

The divided structure of fixing part 10 makes it possible to adjust the space by adding or removing one or more second intermediate fixing pieces 14, keeping first fixing piece 11 and second fixing piece 12 to be fixed to printed boards 2 and 3, respectively. Therefore, first fixing piece 11 and second fixing piece 12 can be soldered to printed boards 2 and 3, respectively. As compared with a fixing part coupled to printed boards by screwing as performed in conventional techniques, the conductivity can be enhanced between first fixing piece 11 and printed board 2 and between second fixing piece 12 and printed board 3.

Further, first fixing piece 11 has male screw 11b projecting toward printed board 2; second fixing piece 12 has male screw 12b projecting toward printed board 3; second intermediate fixing piece 14 has female screw 14a into which male screw 11b of first fixing piece 11 or male screw 12b of second fixing piece 12 is screwed and male screw 14b projecting toward printed board 2 or printed board 3 on the opposite side to that with female screw 14a; and first intermediate fixing piece 13 has female screw 13a into which male screw 11b of first fixing piece 11 and male screw 14b of second intermediate fixing piece 14 is screwed and female screw 13b into which male screw 12b of second fixing piece 12 or female screw 14b of second intermediate fixing piece 14 is screwed. With this configuration, simple rotation of first intermediate fixing piece 13 and/or second intermediate fixing piece 14 in a specific direction divides and assembles fixing part 10, so that increase and decrease in the length of fixing part 10, i.e., the space between printed boards 2 and 3, can be adjusted with ease, further improving the convenience.

Further, fixing part 10 is made of a conductive material and supplies electricity from printed board 2 to printed board 3, so that printed board unit 1-1 can be fabricated to be compact in size with a low cost.

Since the outer circumference of the conductive material forming fixing part 10 is covered with an insulation material, an adverse effect such as noise does not affect wiring patterns on printed boards 2 and 3 even when fixing part 10 supplies electricity from printed board 2 to printed board 3.

Fixing part 10 has conductive tips 11a and 12a, and printed boards 2 and 3 have lands 5 into which corresponding tips are inserted. Soldering tips 11a and 12a being inserted into lands 5 of printed boards 2 and 3 to lands 5 fixes fixing part 10 to printed boards 2 and 3, resulting in improved conductivity between fixing part 10 and printed boards 2 and 3.

Since power supplying patterns 3a and 3b of printed board 3 are connected to lands 5 and tips 11a and 12a are electrically connected to power supplying patterns 3a and 3b via lands 5, it is possible to greatly reduce an adverse effect such as noise affecting signal patterns on the surface of printed boards 2 and 3. Power supply from printed board 2 to printed board 3 via fixing part 10 may cause an adverse effect such as noise affecting on elements mounted to printed boards 2 and 3 and wiring patterns on the printed board. However, forming power supplying patterns 3a and 3b on inner layers of printed boards 2 and 3 for power source supply and electrically connecting the power supplying patterns 3a and 3b to fixing part 10 inhibits adverse effects on wiring patterns and others.

(2) Second Embodiment

Next, description is made for printed board unit 1-2 of a second embodiment of the present invention.

Figure 9A:
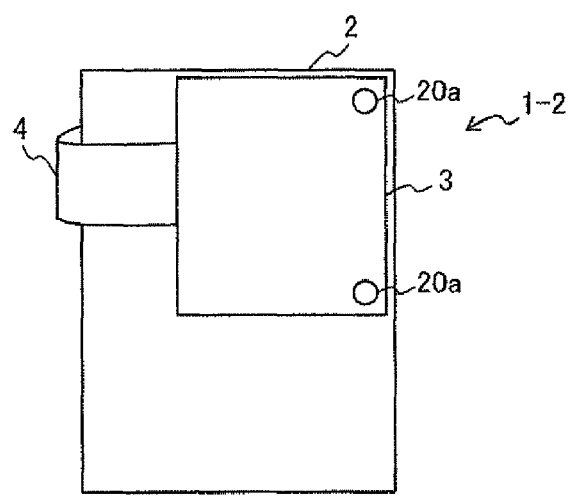
FIGS. 9A-9C are diagrams schematically illustrating a printed board unit according to a second embodiment.
Figure 9B:
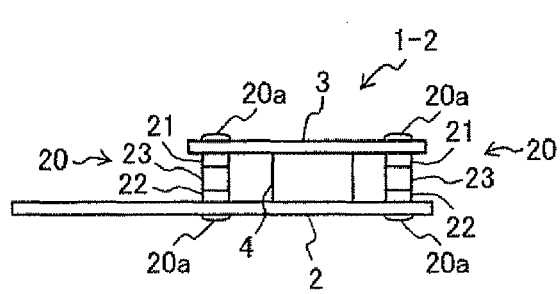
Figure 9C:
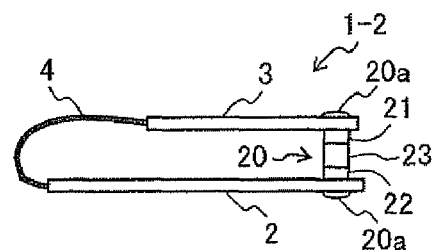

As shown in FIGS. 9A-9C, printed board unit 1-2 is different only in the structure of fixing part 20 from printed board unit 1-1 of the foregoing first embodiment, and the remaining configuration of printed board unit 1-2 is identical to printed board unit 1-1. FIGS. 9A, 9B, and 9C are the top view, the side view seen from the right and the front view of printed board unit 1-2. In FIGS. 9A-9C, like reference numbers designate similar parts or elements to the first embodiment of different illustrated example, so any repetitious description is omitted here. Accordingly, fixing part 20 is hereinafter detailed.

As understood from FIGS. 9A-9C and FIG. 10, fixing part 20 takes a form of a rectangular parallelpiped, and comprises first fixing piece 21 fixed to printed board 3, second fixing piece 22 fixed to printed board 3 and first intermediate fixing piece 23 interposed between first fixing piece 21 and second fixing piece 22 similarly to fixing part 10 of the first embodiment.

Figure 11A:
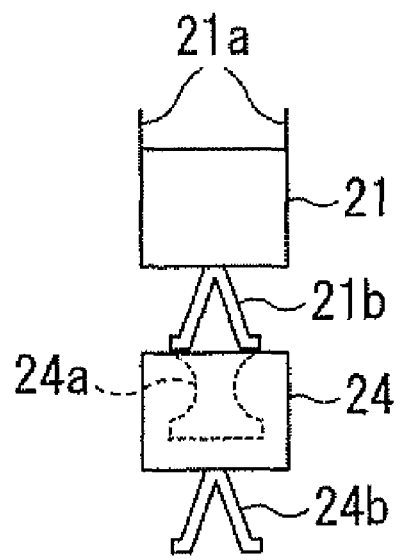
FIGS. 11A and 11B are diagrams an exemplary configuration of the fixing part of the printed board unit of the second embodiment.
Figure 11A:
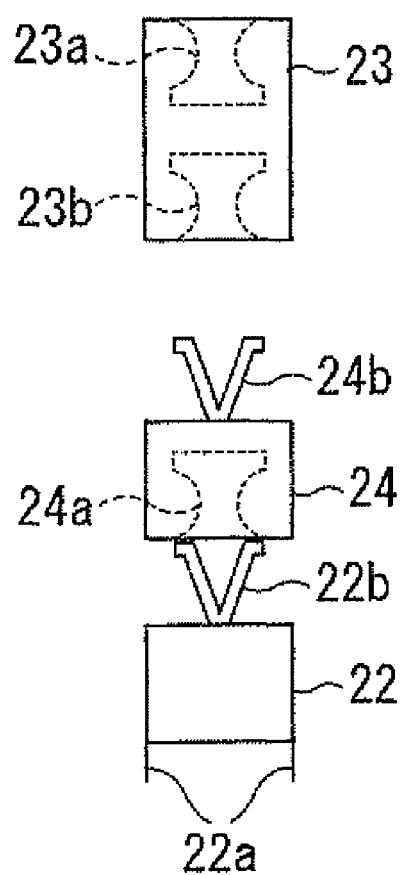
Figure 11B:
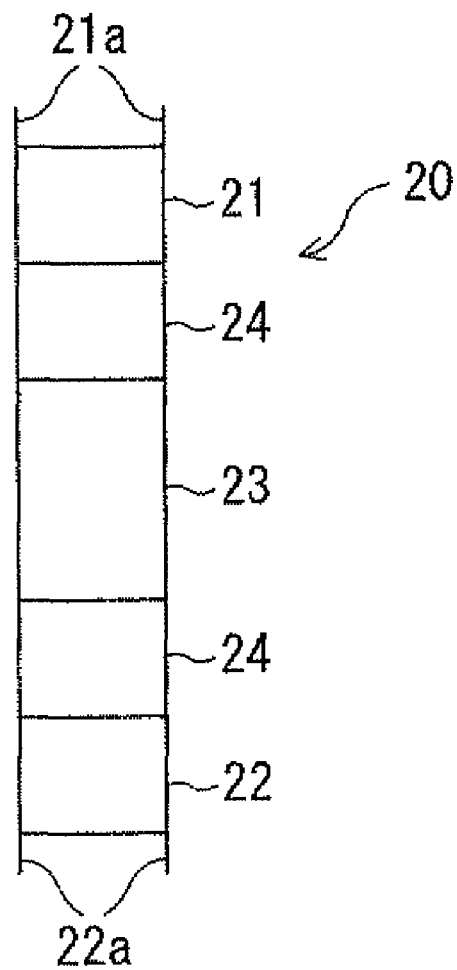

Further, fixing part 20 optionally includes one or more second intermediate fixing piece 24 detachably positioned at least one of between first fixing piece 21 and first intermediate fixing piece 23 and between second fixing piece 22 and first intermediate fixing piece 23, as shown in FIGS. 11A and 11B.

Figure 10:
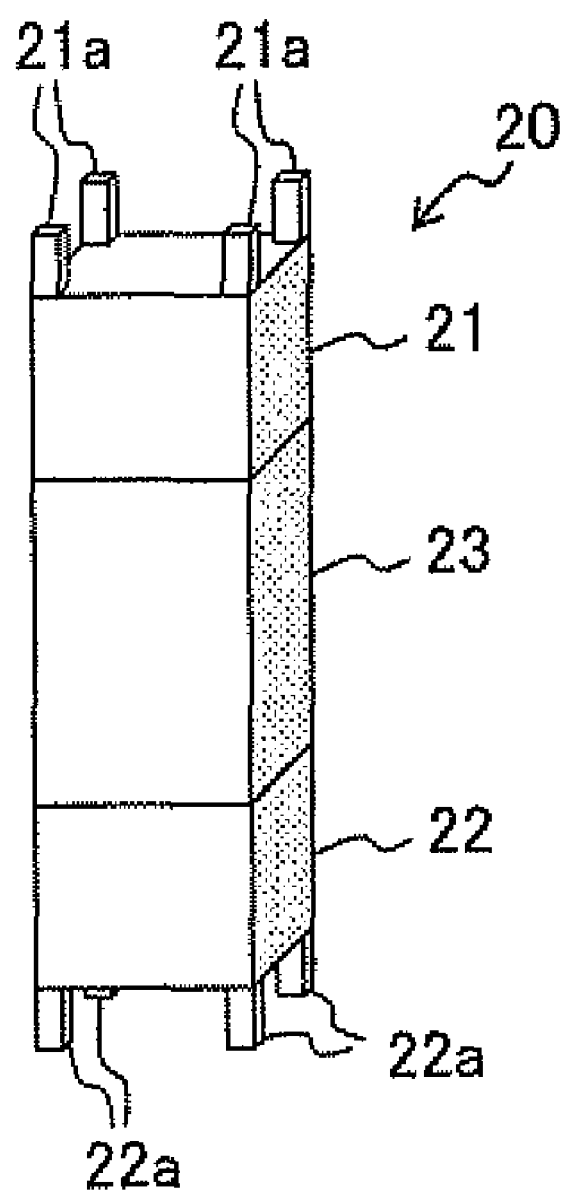
FIG. 10 is a perspective view showing an exemplary fixing part of the printed board unit according to the second embodiment.

As shown in FIG. 10, first fixing piece 21 and second fixing piece 22 includes conductive tips 21a and tips 22a, respectively. Similarly to first fixing piece 11 and second fixing piece 12 of the first embodiment, power supplying patterns 3a and 3b on printed board 3 are electrically connected to first fixing piece 21 and at the same time power supplying patterns 3a and 3b on printed board 2 are electrically connected to second fixing piece 22 by soldering tips 21a and tips 22a being inserted into lands 5 and lands 5 on the printed boards 2 and 3 as shown in FIGS. 6A and 7 to printed boards 2 and 3, respectively.

As shown in FIG. 11A, first fixing piece 21 includes protrusion 21b with a V-shape section projecting toward printed board 2.

Similarly, second fixing piece 22 has protrusion 22b with a V-shape section projecting toward printed board 3.

Figure 12B:
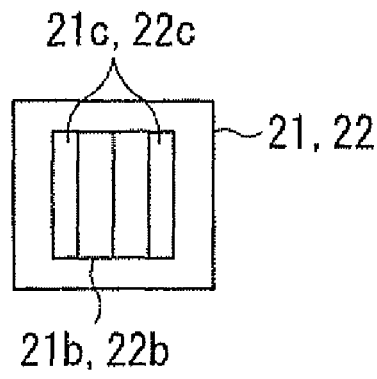
FIGS. 12A-12D are diagrams showing the structure of a first fixing piece and a second fixing piece of the fixing part of the printed board unit of the second embodiment.
Figure 12A:
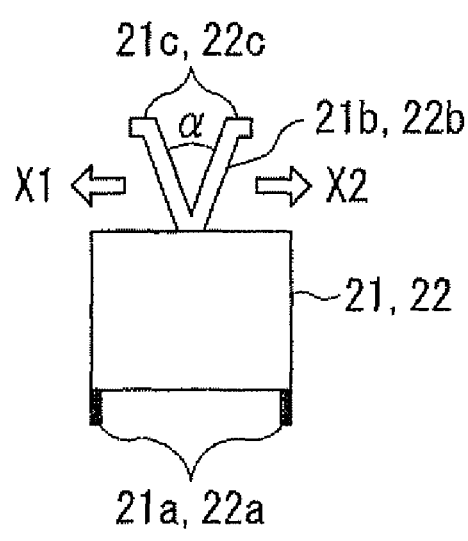
Figure 12D:
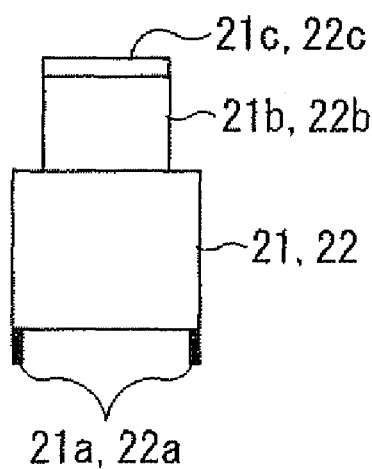
Figure 12C:
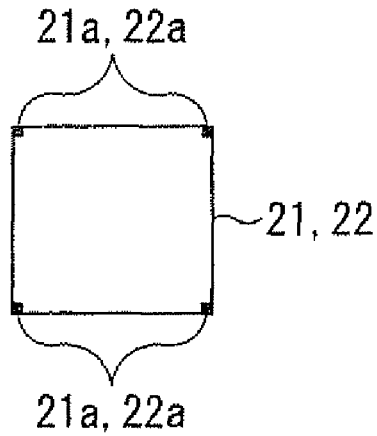

First fixing piece 21 and second fixing piece 22 (hereinafter also called fixing pieces 21 and 22) have a structure shown in FIG. 12A through 12D. Specifically, first fixing piece 21 and second fixing piece 22 are identical in shape but different in the orientation. FIG. 12A is a front view of fixing parts 21 and 22; FIG. 12B is the top view; FIG. 12C is the bottom view; and FIG. 12D is the side view seen from the right.

Protrusions 21b and 22b of fixing parts 21 and 22 are configured to be deformed by elasticity such that interior angle α of the V shape comes to be smaller. In other words, Protrusions 21b and 22b are configured to have elasticity that affects in the directions X1 and X2 perpendicular or substantially perpendicular to the direction toward corresponding recesses 23a, 23b, and 24a that protrusions 21b and 22b are to be fit. The elasticity latches protrusions 21b and 22b onto the insides of corresponding recesses 23a, 23b, and 24a.

Protrusions 21b and 22b of fixing parts 21 and 22 have respectively latches 21c and 22b that are to be latched inside corresponding recesses 23a, 23b, and 24a. In the illustrated example, latches 21c and 22c are portions of fixing parts 21 and 22 extending from protrusions 21b and 21c along directions X1 and X2, respectively.

As shown in FIG. 11A, second intermediate fixing piece 24 includes recess 24a into which protrusion 21b of first fixing piece 21 or protrusion 22b of second fixing piece 22 is detachably fitted, and protrusion 24b with a V-shape section projecting toward printed board 2 or 3 on the opposite face of that with recess 24a.

Figure 13B:
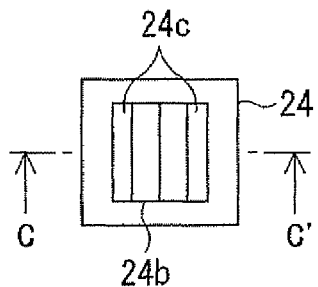
FIGS. 13A-13E are diagrams showing the configuration of the second intermediate fixing piece of the fixing part of the printed board of the second embodiment.
Figure 13A:
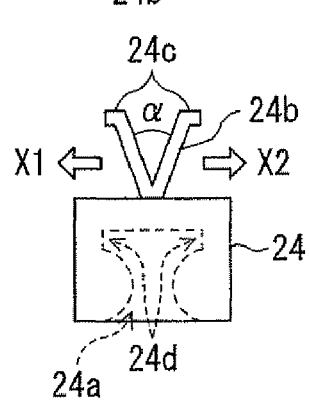
Figure 13C:
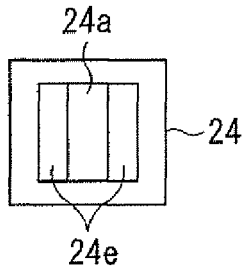
Figure 13D:
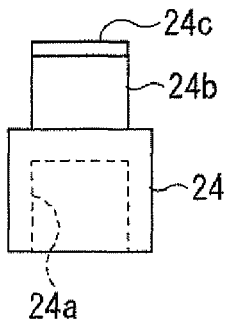
Figure 13E:
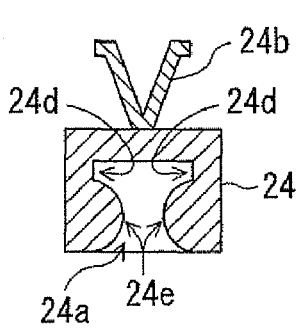
Figure 14:
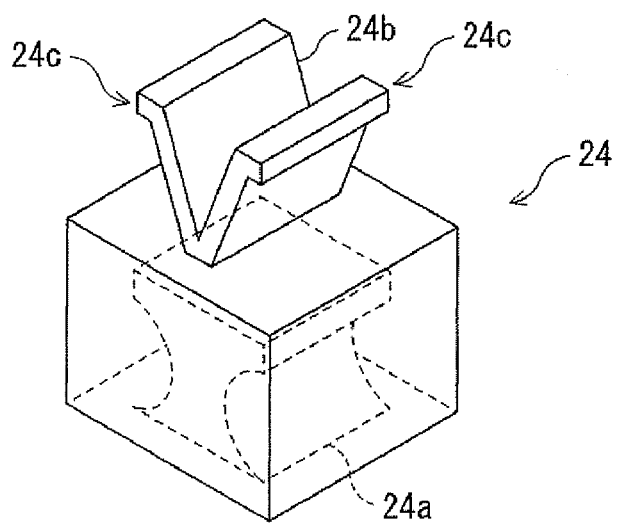
FIG. 14 is a perspective view showing a second intermediate fixing piece of the fixing part of the printed board unit of the second embodiment.

Specifically, second intermediate fixing piece 24 is configured as shown in FIGS. 13A-13E and FIG. 14. FIG. 13A is the front view of second intermediate fixing piece 24; FIG. 13B is the top view; FIG. 13C is the bottom view; FIG. 13D is the side view seen from the right; FIG. 13E is a C-C' sectional view of FIG. 13B; and FIG. 14 is a perspective view of second intermediate fixing piece 24.

Protrusion 24b of second intermediate fixing piece 24 is identical to protrusions 21b and 22b of fixing parts 21 and 22, respectively.

Recess 24a of second intermediate fixing piece 24 accommodates any one of protrusions 21b, 22b, and 24b, and has latch receptors 24d to latch protrusions 21b, 22b, or 24b onto the inside of recess 24a. Each latch receptor 24d takes a C-shape to accommodate the shapes of latches 21c, 22c, and 24c.

Recess 24a of second intermediate fixing piece 24 includes projections 24e that exerts elasticity of protrusions 21b, 22b, and 24b. In other words, protrusions 24e make the center portion of recess 24a constrict, so that protrusions 21b, 22b, and 24b are elastically deformed to exert elasticity at the constriction.

Protrusions 24e also function to guide protrusions 21b, 22b, or 24b inserting into and drawing from recess 24a.

Here, description is made in relation to a state transition of protrusion 22b of second fixing piece 22 from fitting into recess 24a of second intermediate fixing piece 24 to drawing from recess 24a with reference to FIGS. 15A-15G. A state transition of protrusion 21b of first fixing piece 21 when being fitted into and drawn from recess 24a of second intermediate fixing piece 24, a state transition to protrusion 24b of second intermediate fixing piece 24 when being fitted into and drawn from recess 24a of another second intermediate fixing piece 24, and a state transition of protrusion 24b of second intermediate fixing piece 24, protrusion 21b of first fixing piece 21, or protrusion 22b of second fixing piece 22 when being fitted into and drawn from recess 23a or recess 23b of first intermediate fixing piece 23 also proceed as shown in FIGS. 15A-15G.

Recess 24a of second intermediate fixing piece 24 being in a state shown in FIG. 15A moves in the direction that arrow Y1 indicates to fit protrusion 22b of second fixing piece 22 into recess 24a.

Then, further application of a predetermined force or more in direction Y1 to second intermediate fixing piece 24 with recess 24a being in contact with protrusion 22b at the entrance of the recess 24a as shown in FIG. 15B elastically deforms protrusion 22b such that the interior angle α becomes smaller while being guided along the inner circumference of recess 24a, i.e., projections 24e as shown in FIG. 15C.

Further movement of second intermediate fixing piece 24 in the Y1 direction fits latches 22c of protrusion 22b into latch receptors 24d of second intermediate fixing piece 24a to be latched as shown in FIG. 15D. As a consequence, protrusion 22b is fitted into recess 24 to couple second intermediate fixing piece 24 to second fixing piece 22.

At that time, protrusion 22b is preferably in contact with projections 24e of recess 24a as shown in portions Z1 and Z2 of FIG. 15D. In detail, it is preferable that protrusion 22b is elastically deformed in recess 24a to exert elasticity in X1 and X2 directions. Thereby, connection between second fixing piece 22 and second intermediate fixing piece 24 is stabilized.

Then, application of a predetermined force or more in the direction indicated by arrow Y2 to second intermediate fixing piece 24 being in a fitting state shown in FIG. 15D draws latches 22c of second fixing piece 22b from latch receptors 24d of recess 24a, deforms protrusion 22b being guided along projections 24e, as shown in FIGS. 15E and 15F, and finally draws protrusion 22b from recess 24a as shown in FIG. 15G.

First intermediate fixing piece 23 includes recess 23a into which protrusion 24b of first fixing piece 21 or protrusion 24b of second intermediate fixing piece 24 positioned between first intermediate fixing piece 23 and first fixing piece 21 is detachably fitted and recess 23b into which protrusion 22b of second fixing piece 22 or protrusion 24b of second intermediate fixing piece 24 positioned between first intermediate fixing piece 23 and second fixing piece 22 is detachably fitted, as shown in FIG. 11A.

Figure 16B:
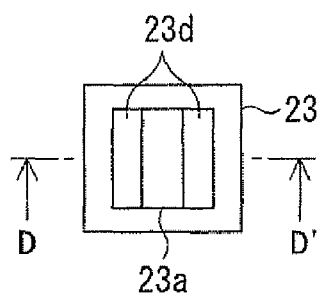
Figure 16A:
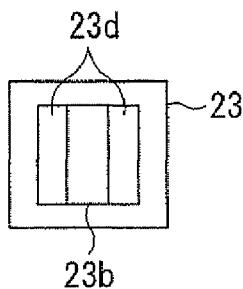
Figure 16D:
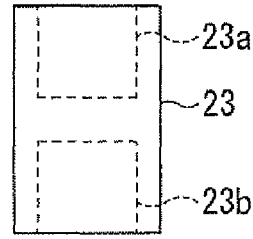
Figure 16E:
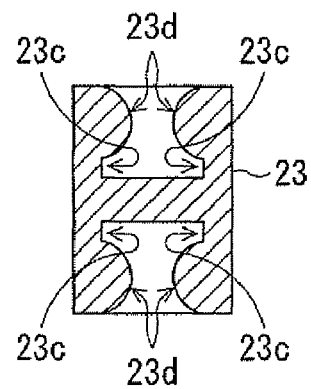
Figure 17:
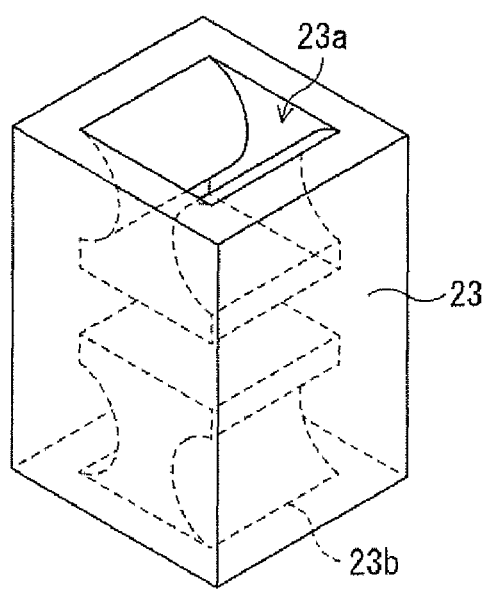
FIG. 17 is a perspective view illustrating the first intermediate fixing piece of the fixing part of the printed board unit of the second embodiment.

More specifically, first intermediate fixing piece 23 has a structure detailed in FIGS. 16A-16E and FIG. 17. FIG. 16A is the front view of first intermediate fixing piece 23; FIG. 16B is the top view; FIG. 16C is the bottom view; FIG. 16D is the side view seen from right; FIG. 16E is the D-D' sectional view of FIG. 16B; and FIG. 17 is a perspective view of first intermediate fixing piece 23.

Recesses 23a and 23b of first intermediate fixing piece 23 are both identical to recess 24a of second intermediate fixing piece 24 to have latch receptors 23c and projections 23d.

In the example shown in FIG. 11A, protrusion 21b of first fixing piece 21 is fitted into recess 24a of second intermediate fixing piece 24; protrusion 22b of second fixing piece 22 is fitted into recess 24a of (another) second intermediate fixing piece 24; and protrusions 24b of the two second intermediate fixing pieces 24 are fitted into recesses 23a and 23b of first intermediate fixing piece 23. Thereby, fixing part 20 shown in FIG. 11B is formed.

As described above, second intermediate fixing piece 24 is detachably inserted, and one or more second intermediate fixing pieces 24 can therefore be added to between first fixing piece 21 and second intermediate fixing piece 24, between second intermediate fixing piece 24 and first intermediate fixing piece 23, or between second intermediate fixing piece 24 and second fixing piece 22.

With this configuration, fixing part 20 can vary the length thereof in the direction in which the predetermined space between printed boards 2 and 3 increases or decreases. In other words, fixing part 20 can adjust the space between printed boards 2 and 3.

Further, fixing part 20 is made of conductive material and is connected to the power supplying wire of printed board 2 to supply power to printed board 3.

In other words, first fixing piece 21, second fixing piece 22, first intermediate fixing piece 23, and second intermediate fixing piece 24 are formed of conductive material. In this case, the outer circumference surface of fixing part 20 is preferably covered with insulation material.

For example, if fixing part 20 shown in FIG. 11B is coupled to printed boards 2 and 3, the electricity from printed board 2 is supplied trough, in sequence from the bottom of FIG. 11B, second fixing piece 22, second intermediate fixing piece 24, first intermediate fixing piece 23, second intermediate fixing piece 24, first fixing piece 21, and tips 21a to printed board 3.

Printed board unit 1-2 of the second embodiment can obtain the same advantages as the first embodiment because of the structure described above.

Protrusions 21b, 22b, and 24b are latched inside corresponding recesses 24a, 23a and 23b to surely join pieces 21-24 one another, concurrently improving the conductivity through the pieces 21-24.

Further, protrusions 21b, 22b, and 24b include latches 21c, 22c, and 24c and recesses 24a, 23a, and 23b include latch receptors 24d and 23c to latch corresponding latches 21c, 22c, and 24c. This structure surely fit pieces 21-24 one another.

(3) Others

The present invention should by no means be limited to the foregoing embodiments and various changes and modifications can be suggested without departing from the sprit of the present invention.

For example, the shape of fixing parts 10 and 20 of the above first and second embodiments, that is, first fixing pieces 11 and 21, second fixing pieces 12 and 22, first intermediate fixing pieces 13 and 23, and second intermediate fixing pieces 14 and 24 are not limited to those described above and can be variously modified without departing from the concept of the present invention.

In particular, the shapes of protrusions 21b, 22b, and 24b possessed by pieces 21, 22, and 24 of fixing part 20 and the corresponding recesses 23a, 23b, and 24a are not limited to the above example. Alternatively, it is sufficient that protrusions 21b, 22b, and 24b are elastically deformed to exert elasticity as being fitted into recesses 23a, 23b, and 24a; that protrusions 21b, 22b, and 24b have latches to be latched inside recess 23a, 23b and 24a; and that recesses 23a, 22b, and 24b possess latch receptors to receive these latches.

Alternatively, fixing part 20 may have a structure shown in FIGS. 18A and 18B. Specifically, first fixing piece 21' may include recess 21b' as a substitute for protrusion 21b, and second intermediate fixing piece 24 may be fitted into recess 21b' of first fixing piece 21'.

In other words, second intermediate fixing piece 24 functions as an intermediate fixing piece that is to be interposed between first fixing piece 21' and second fixing piece 22, and fixing part 20 can increase or decrease the number of second intermediate fixing pieces 24.

This alternative structure can obtain same advantages as the second embodiment.

Further alternatively, fixing part 20 may have a structure shown in FIGS. 19A and 19B. Specifically, second fixing piece 22' may include recess 22b' as a substitute for protrusion 22b, and second intermediate fixing piece 24 may be fitted to recess 22b' of second fixing piece 22'.

In other words, second intermediate fixing piece 24 functions as an intermediate fixing piece that is to be interposed between first fixing piece 21 and second fixing piece 22', and fixing part 20 can increase and decrease the number of second intermediate fixing pieces 24.

That also secures the same advantages as the second embodiment.

Figure 20:
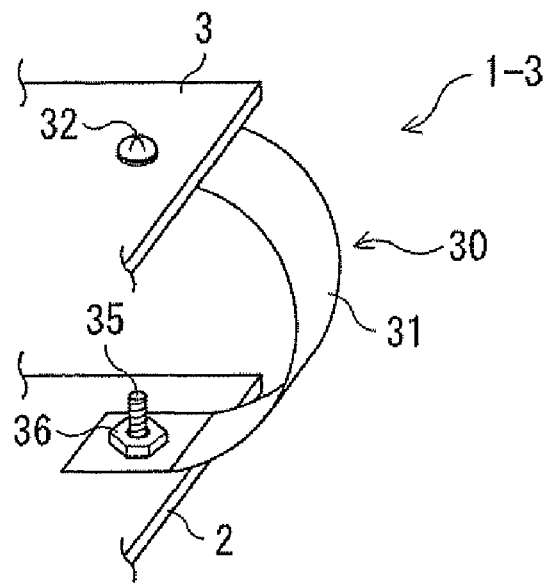
FIG. 20 is a perspective view illustrating a fixing part of a printed board unit according to a modification.

Still further alternatively, spring plate 31 may function as fixing part 30 having one end fixed to printed board 2 and the other end fixed to printed board 3, as shown in FIG. 20.

Figure 21:
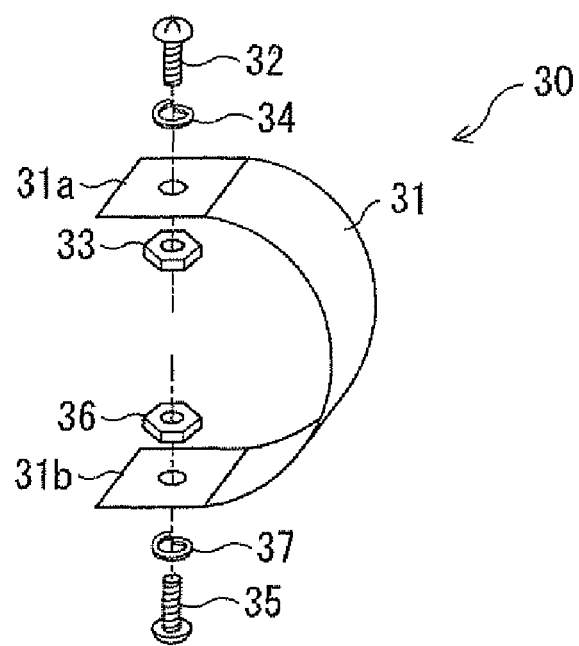
FIG. 21 is a diagram showing the configuration of the fixing part of the printed board unit of FIG. 20.

In this alternation, fixing part 30 has a configuration exemplified by that shown in FIG. 21. Fixing part 30 comprises elastic spring plate 31, a set of bolt 32, nut 33, and spring washer 34 for attachment of to printed board 3 and a set of bolt 35, nut 36 and spring washer 37 for attachment of to printed board 2. Here, portions 31a and 31b to be fixed respectively to printed boards 2 and 3 are preferably formed non-elastic material.

Figure 22:
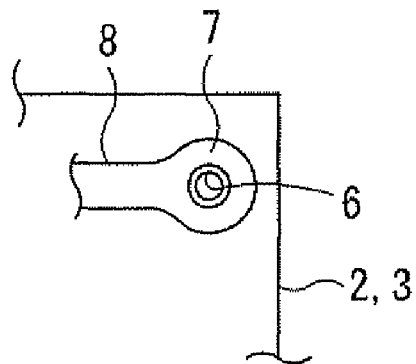
FIG. 22 is a diagram showing the configuration of a printed board of the printed board unit of FIG. 20.

Also in this case, printed boards 2 and 3 include screw holes 6 through which bolts 32 and 35 penetrate, lands 7 with copper foil, and wiring patterns 8 coupled to land 7, as shown in FIG. 22.

Figure 23A:
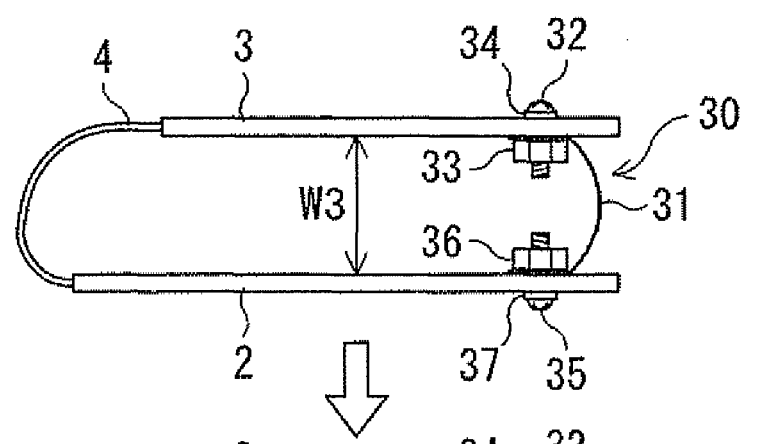
FIGS. 23A and 23B are diagram showing the configuration of the fixing part shown in FIG. 20.

As shown in FIG. 23A, spring plate 31 is fixed at end portion 31a (to printed board 3) with bolt 32, nut 33, and spring washer 34 and fixed at the other end portion 31b (to printed board 2) with bolt 35, nut 36 and spring washer 37.

Figure 23B:
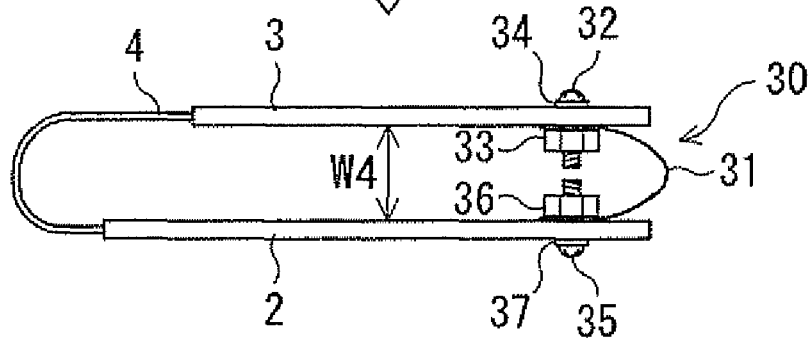
Figure 24A:
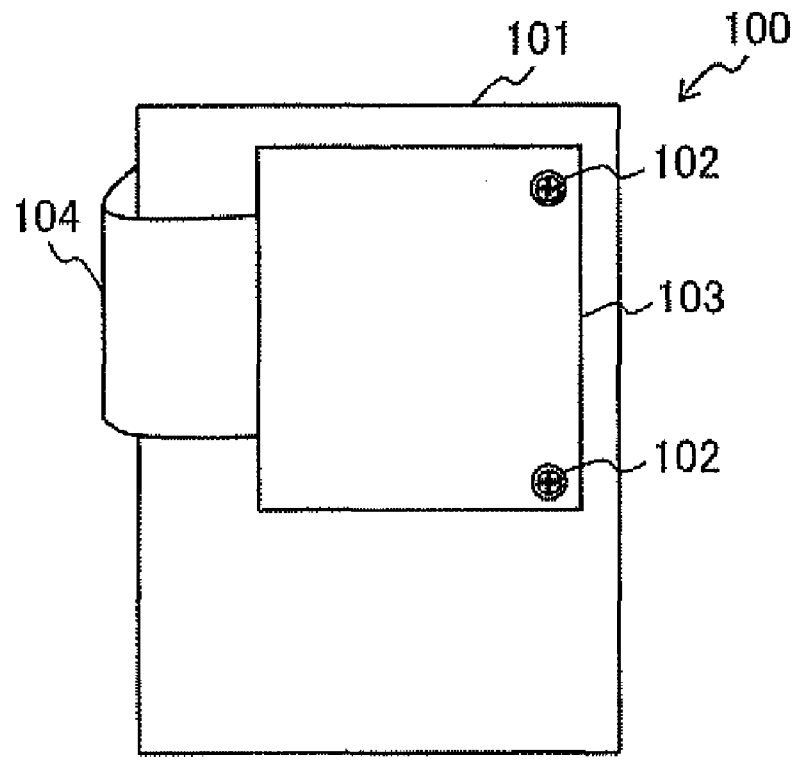
FIGS. 24A and 24B are diagram showing the configuration a conventional printed board unit.
Figure 24B:
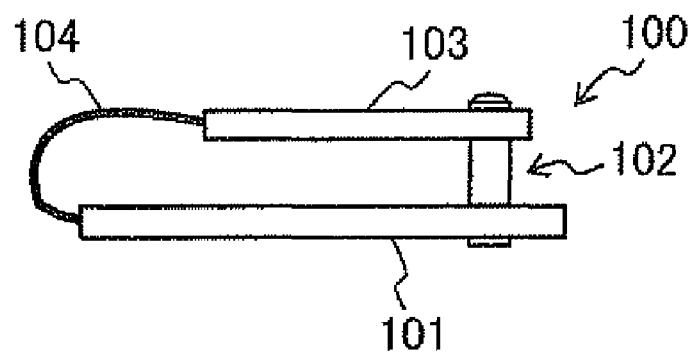

Further, plastically deformation of spring plate 31 being in the state shown in FIG. 23A varies the space W3 between printed boards 2 and 3 from space W3 to the space W4 narrower than space W3 as shown in FIG. 23B.

This configuration can attain the same advantages as the foregoing embodiments.

In addition, fixing part 30 is preferably formed of conductive material and preferably supplies electricity from printed board 2 to printed board 3 in the same manner as the foregoing embodiments.

In the foregoing embodiments, fixing parts 10 and 20 are fixed to printed boards 2 and 3 by soldering, but the present invention does not limit the fixing method to soldering. Alternatively, fixing parts 10 and 20 may be fixed to printed boards 2 and 3 with screws.

From the invention thus described, it will be obvious that the same may be varied in many ways. Such variations are not regarded as a departure from the spirit and scope of the invention, and all such modifications as would be obvious to one skilled in the art are intended to be included within the scope of the following claims.

What is claimed is:

1. A printed board unit comprising:
a plurality printed board including a first printed board and a second printed board; and
at least one fixing part, interposed between said first printed board and said second printed board, fixing said first printed board and said second printed board such that said first printed board and said second printed board overlap and keep a predetermined space between said first printed board and said second printed board, wherein
said fixing part comprises:
    a first fixing piece fixed to said first printed board;
    a second fixing piece fixed to said second printed board;
    a first intermediate fixing piece disposed between said first fixing piece and said second fixing piece; and
    optionally one or more second intermediate fixing pieces, detachably interposed at least one of between said first fixing piece and said first intermediate fixing piece and between said second fixing piece and said first intermediate fixing piece, wherein
said first fixing piece comprises a first male screw projecting toward said second printed board;
said second fixing piece comprises a second male screw projecting toward said first printed board;
each of said second intermediate fixing pieces comprises
    a first female screw into which said first male screw of said first fixing piece or said second male screw, of said second fixing piece is screwed, and
    a third male screw projecting toward said first printed board or toward said second printed board on an opposite surface to that with said first female screw; and
said first intermediate fixing piece comprises
    a second female screw into which said first male screw of said first fixing piece or said third male screw of one of said second intermediate fixing pieces is screwed, and
    a third female screw into which said second male screw of said second fixing piece or said third male screw of one of said second intermediate fixing pieces is screwed.

2. A printed board unit comprising:
a plurality printed board including a first printed board and a second printed board; and
at least one fixing part, interposed between said first printed board and said second printed board, fixing said first printed board and said second printed board such that said first printed board and said second printed board overlap and keep a predetermined space between said first printed board and said second printed board, wherein
said fixing part comprises:
    a first fixing piece fixed to said first printed board;
    a second fixing piece fixed to said second printed board;
    a first intermediate fixing piece disposed between said first fixing piece and said second fixing piece; and
    optionally one or more second intermediate fixing pieces, detachably interposed at least one of between said first fixing piece and said first intermediate fixing piece and between said second fixing piece and said first intermediate fixing piece, wherein
said first fixing piece comprises a first protrusion projecting toward said second printed board;
said second fixing piece comprises a second protrusion projecting toward said first printed board;

each of said second intermediate fixing pieces comprises
a first recess into which said first protrusion of said first fixing piece or said second protrusion of said second fixing piece is detachably fitted, and
a third protrusion projecting toward said first printed board or toward said second printed board on an opposite surface to that with said first recess; and
said first intermediate fixing piece comprises
a second recess into which said first protrusion of said first fixing piece or said third protrusion of one of said second intermediate fixing pieces is detachably fitted, and
a third recess into which said second protrusion of said second fixing piece or said third protrusion of one of said second intermediate fixing pieces is detachably fitted.

3. A printed board unit according to claim 2, wherein:
each of said first protrusion, said second protrusion and said third protrusion has elasticity acting in the direction perpendicular or substantially perpendicular to the direction in which each said protrusion is fitted into a corresponding one of said first recess, said second recess, and said third recess; and
each said protrusion is latched onto said corresponding one recess by the elasticity.

4. A printed board unit according to claim 2, wherein:
each of said first protrusion, said second protrusion and said third protrusion comprises a latch extending in the direction perpendicular or substantially perpendicular to the direction in which each said protrusion is fitted into a corresponding one of said first recess, said second recess, and said third recess; and
each of said first recess, said second recess, and said third recess comprises a latch receptor that latches said latch of a corresponding one of said first protrusion, said second protrusion and said third protrusion.

5. A printed board unit comprising:
a plurality printed board including a first printed board and a second printed board; and
at least one fixing part, interposed between said first printed board and said second printed board, fixing said first printed board and said second printed board such that said first printed board and said second printed board overlap and keep a predetermined space between said first printed board and said second printed board, wherein
said fixing part comprises:
a first fixing piece fixed to said first printed board;
a second fixing piece fixed to said second printed board; and
at least one intermediate fixing pieces disposed between said first fixing piece and said second fixing piece, wherein
said second fixing piece comprises a first protrusion projecting toward said first printed board;
said intermediate fixing piece comprises a first recess into which said first protrusion of said second fixing piece is detachably fitted, and a second protrusion projecting toward said first printed board on an opposite surface to that with said first recess; and
said first fixing piece comprises a second recess into which said second protrusion of said intermediate fixing piece is detachably fitted.

6. A printed board unit according to claim 5, wherein:
said first protrusion and said second protrusion have elasticity acting in the direction perpendicular or substantially perpendicular to the direction in which said first protrusion and said second protrusion fitted into said first recess and said second recess, respectively; and
said first protrusion and said second protrusion are respectively latched onto said first recess and said second recess by the elasticity.

7. A printed board unit according to claim 5, wherein:
each of said first protrusion and said second protrusion comprises a latch extending in the direction perpendicular or substantially perpendicular to the direction in which each said protrusion is fitted into a corresponding one of said first recess and said second recess; and
each of said first recess and said second recess comprises a latch receptor that latches said latch of a corresponding one of said first protrusion and said second protrusion.

8. A printed board unit comprising:
a plurality printed board including a first printed board and a second printed board; and
at least one fixing part, interposed between said first printed board and said second printed board, fixing said first printed board and said second printed board such that said first printed board and said second printed board overlap and keep a predetermined space between said first printed board and said second printed board, wherein
said fixing part variably determines the predetermined space;
said fixing part comprises a conductive material and is coupled to a power supplying wire on said second printed board to supply electricity to said first printed board;
said fixing part comprises two or more conductive tips;
each of said first printed board and said second printed board comprises a land into which at least one of said conductive tips is inserted; and
said fixing part is fixed to said first printed board and said second printed board by soldering said conductive tips being inserted into said lands on said first printed board and said second printed board.

9. A printed board unit according to claim 8, wherein:
said first printed board or said second printed board includes an internal layer with a power supply pattern; and
said power supply pattern is connected to said land of said first printed board or said second printed board, so that said conductive tip on said fixing part are electrically coupled to said power supply pattern via said land of said first printed board or said second printed board.

10. A printed board unit according to claim 8, wherein said fixing part comprises a spring plate having a first end and a second end coupled to said first printed board and said second printed board, respectively.

11. A printed board unit according to claim 8, wherein the conductive material of said fixing part is covered with an insulation material.

12. A fixing part for a printed board unit including a first printed board and a second printed board, said fixing part being configured to:
be interposed between the first printed board and the second printed board;
fix the first printed board and the second printed board such that the first printed board and the second printed board overlap and keep a predetermined space between the first printed board and the second printed board; and
variably determine the predetermined space, wherein
a first fixing piece fixed to the first printed board;
a second fixing piece fixed to the second printed board;

a first intermediate fixing piece disposed between said first fixing piece and said second fixing piece; and optionally one or more second intermediate fixing pieces, detachably interposed at least one of between said first fixing piece and said first intermediate fixing piece and between said second fixing piece and said first intermediate fixing piece, wherein said first fixing piece comprises a first male screw projecting toward said second printed board;

said second fixing piece comprises a second male screw projecting toward said first printed board;

each of said second intermediate fixing pieces comprises
a first female screw into which said first male screw of said first fixing piece or said second male screw of said second fixing piece is screwed, and
a third male screw projecting toward said first printed board or toward said second printed board on an opposite surface to that with said first female screw; and said first intermediate fixing piece comprises
a second female screw into which said first male screw of said first fixing piece or said third male screw of one of said second intermediate fixing pieces is screwed, and
a third female screw into which said second male screw of said second fixing piece or said third male screw of one of said second intermediate fixing pieces is screwed.

13. A fixing part for a printed board unit including a first printed board and a second printed board, said fixing part being configured to:
be interposed between the first printed board and the second printed board;
fix the first printed board and the second printed board such that the first printed board and the second printed board overlap and keep a predetermined space between the first printed board and the second printed board; and
variably determine the predetermined space, wherein
a first fixing piece fixed to the first printed board;
a second fixing piece fixed to the second printed board;
a first intermediate fixing piece disposed between said first fixing piece and said second fixing piece; and
optionally one or more second intermediate fixing pieces, detachably interposed at least one of between said first fixing piece and said first intermediate fixing piece and between said second fixing piece and said first intermediate fixing piece, wherein
said first fixing piece comprises a first protrusion projecting toward said second printed board;
said second fixing piece comprises a second protrusion projecting toward said first printed board;
each of said second intermediate fixing pieces comprises
a first recess into which said first protrusion of said first fixing piece or said second protrusion of said second fixing piece is detachably fitted, and
a third protrusion projecting toward said first printed board or toward said second printed board on an opposite surface to that with said first recess; and said first intermediate fixing piece comprises
a second recess into which said first protrusion of said first fixing piece or said third protrusion of one of said second intermediate fixing pieces is detachably fitted, and
a third recess into which said second protrusion of said second fixing piece or said third protrusion of one of said second intermediate fixing pieces is detachably fitted.

14. A fixing part for a printed board unit including a first printed board and a second printed board, said fixing part being configured to:
be interposed between the first printed board and the second printed board;
fix the first printed board and the second printed board such that the first printed board and the second printed board overlap and keep a predetermined space between the first printed board and the second printed board; and
variably determine the predetermined space, wherein
a first fixing piece fixed to said first printed board;
a second fixing piece fixed to said second printed board; and
at least one intermediate fixing pieces disposed between said first fixing piece and said second fixing piece, wherein
said second fixing piece comprises a first protrusion projecting toward said first printed board;
said intermediate fixing piece comprises a first recess into which said first protrusion of said second fixing piece is detachably fitted, and a second protrusion projecting toward said first printed board on an opposite surface to that with said first recess; and
said first fixing piece comprises a second recess into which said second protrusion of said intermediate fixing piece is detachably fitted.

15. A fixing part for a printed board unit including a first printed board and a second printed board, said fixing part being configured to:
be interposed between the first printed board and the second printed board;
fix the first printed board and the second printed board such that the first printed board and the second printed board overlap and keep a predetermined space between the first printed board and the second printed board; and
variably determine the predetermined space, wherein
said fixing part comprises a conductive material and is coupled to a power supplying wire on said second printed board to supply electricity to said first printed board;
said fixing part comprises two or more conductive tips;
each of said first printed board and said second printed board comprises a land into which at least one of said conductive tips is inserted; and
said fixing part is fixed to said first printed board and said second printed board by soldering said conductive tips being inserted into said lands on said first printed board and said second printed board.

\* \* \* \* \*

UNITED STATES PATENT AND TRADEMARK OFFICE
CERTIFICATE OF CORRECTION

| | | |
|---|---|---|
| PATENT NO. | : 8,189,347 B2 | Page 1 of 1 |
| APPLICATION NO. | : 12/275467 | |
| DATED | : May 29, 2012 | |
| INVENTOR(S) | : Takahide Mukouyama | |

It is certified that error appears in the above-identified patent and that said Letters Patent is hereby corrected as shown below:

Column 14, Line 28, In Claim 1, delete "screw," and insert -- screw --, therefor.

Signed and Sealed this
Seventh Day of August, 2012

David J. Kappos
*Director of the United States Patent and Trademark Office*